(12) United States Patent
Nadeau-Dostie

(10) Patent No.: US 6,745,359 B2
(45) Date of Patent: Jun. 1, 2004

(54) METHOD OF MASKING CORRUPT BITS DURING SIGNATURE ANALYSIS AND CIRCUIT FOR USE THEREWITH

(75) Inventor: Benoit Nadeau-Dostie, Aylmer (CA)

(73) Assignee: LogicVision, Inc., San Jose, CA (US)

(*) Notice: Subject to any disclaimer, the term of this patent is extended or adjusted under 35 U.S.C. 154(b) by 103 days.

(21) Appl. No.: 10/162,917

(22) Filed: Jun. 6, 2002

(65) Prior Publication Data
US 2003/0229833 A1 Dec. 11, 2003

(51) Int. Cl.[7] .................................................. G01R 37/28
(52) U.S. Cl. ............................................................ 714/726
(58) Field of Search ................................. 714/732, 724, 714/726, 727; 326/16

(56) References Cited

U.S. PATENT DOCUMENTS

| 4,503,537 A | 3/1985 | McAnney |
| 4,817,093 A | 3/1989 | Jacobs et al. |
| 5,694,402 A | 12/1997 | Butler et al. |
| 5,887,003 A | 3/1999 | Ranson et al. |
| 6,158,033 A | 12/2000 | Wagner et al. |
| 6,477,672 B1 | 11/2002 | Satoh |
| 6,557,129 B1 | 4/2003 | Rajski et al. |

FOREIGN PATENT DOCUMENTS

WO    WO 01/38889 A1    5/2001

OTHER PUBLICATIONS

Rajski et al., "Fault Diagnosis in Scan–Based Designs", International Test Conference 1997 Proceedings, Nov. 1–6, 1997, p. 894–902, Washington, D.C.

Primary Examiner—Albert Decady
Assistant Examiner—Shelly A Chase
(74) Attorney, Agent, or Firm—Eugene E. Proulx

(57) ABSTRACT

A method of masking corrupt bits in test response pattern scan chains in an integrated circuit, comprising loading and applying a set of test patterns in the scan chains so as to obtain corresponding test response patterns; and masking bits of the test response patterns located in scan chains identified by a chain mask and at a position identified by a position mask.

55 Claims, 3 Drawing Sheets

METHOD OF MASKING CORRUPT BITS DURING SIGNATURE ANALYSIS AND CIRCUIT FOR USE THEREWITH

BACKGROUND OF THE INVENTION

1. Field of the invention

The present invention relates, in general, to the testing of integrated circuits and, more specifically, to a method of performing signature analysis in presence of corrupt bits.

2. Description of Related Art

In integrated circuits which are designed for embedded test, memory elements in the circuit are organized into a plurality of scan chains having respective serial inputs and serial outputs. The serial outputs are connected to a signature register through a masking circuit. The memory elements are connected to combinational logic circuits. During a scan test of the circuit, test patterns are serially loaded into the memory elements through the serial inputs and then applied to the circuit. The response of the combinational circuits is then captured by the memory elements and unloaded by shifting out the contents of the memory elements and applying it to the input of a signature register. Usually, the circuits are designed so that the response of the combinational circuits is predictable and repeatable. That is, the memory elements always capture the same output response to a given test pattern and the signature register always generates the same signature. However, there are circumstances in which it is desired to be able to compute a signature, even though the output response of the circuit is not completely predictable and repeatable. This is to allow the part of the output response that is predictable and repeatable to be analyzed. A non-repeatable output response can result from logic being tested using some test patterns that are not valid functional patterns. It could also be the result of a design error or a defect. Whatever the reason may be, the corrupt bits (each memory element stores one bit of the output response) must be masked so that the signature register can generate a repeatable signature for a 'good circuit', i.e. a circuit that is good except for some of the logic generating the corrupt bits.

Several methods have been developed for masking corrupt bits during signature computation. WO 01/38889 and U.S. Pat. Nos. 5,694,402, 4,817,093 and 6,158,033 are representative examples. U.S. Pat. No. 6,158,033 is not applicable to scannable circuits and is not discussed any further herein. The three other methods propose several embodiments to perform diagnosis of scannable circuits. None of the embodiments or combinations thereof have the features discussed above because these features are not required to perform diagnosis. In fact, the fault coverage of each test is minimized to isolate the source of the corrupt bits. Several such tests must be applied, resulting in long test times. For embodiments that require masking of individual bit positions in the scan chain, it is well known that testers are not able to provide mask data at high clock rates. Also, no mechanism has thusfar been proposed for providing default mask data information on-chip so that a test can be executed autonomously in the field.

For all these reasons, there is a need for an efficient signature analysis method for use in performing high quality, at-speed tests in presence of corrupt bits.

SUMMARY OF THE INVENTION

The present invention seeks to provide a masking method and circuit which will maximize the fault coverage of the test, minimize the amount of additional logic required to implement the mask circuitry, minimize the number of clock cycles required to run the test; maximize the clock rate at which the signature can be computed; minimize the amount of information to be stored on the tester; and provide a default mode that does not require any information from the tester. These features will allow an at-speed production test or field test to be performed while maximizing fault coverage.

One aspect of the present invention is generally defined as A method of masking corrupt bits in test response pattern scan chains in an integrated circuit, comprising loading and applying a set of test patterns in the scan chains so as to obtain corresponding test response patterns; and masking bits of the test response patterns located in scan chains identified by a chain mask and at a position identified by a position mask.

One embodiment of the present invention provides individual registers for a position mask and a chain mask and the method further comprises loading a position mask into a position mask register with the position mask identifying scan chain bit positions having corrupt bits; and loading a chain mask into a chain mask register, with the chain mask identifying scan chains having corrupt bits.

Another embodiment provides for loading a position mask and a chain mask into the same register. The testing method comprises loading and applying the two masks in a sequence which comprises loading one of a position mask and a chain mask into a mask register; loading and applying first test patterns to the circuit so as to obtain first circuit test response patterns; while scanning out the first test response patterns along the scan chains, applying a masking bit in the first test response patterns according to the one mask in the mask register; loading and applying second test patterns to the circuit so as to obtain a second circuit test response; loading the other of the position mask and chain mask into the mask register; while scanning out the second test response patterns along the scan chains, applying a masking bit according to the other mask in the mask register.

Another aspect of the present invention is generally defined as a masking circuit for use in an integrated circuit for masking bits in scan chains, comprising mask storage means for storing a bit position mask identifying scan chain bit positions to be masked and a chain mask identifying scan chains having bits to be masked; and gating means associated with each scan chain, each gating means having a scan chain input for receiving the serial output of an associated scan chain, a position mask input connected to a position mask output of the storage means, and a chain mask inputs connected to chain mask outputs of the storage means, and a gating means output corresponding to each scan chain, the gating means being operable to gate a masking bit derived from the position and chain mask inputs with the scan chain serial output and apply a resulting gated bit to the gating means output.

BRIEF DESCRIPTION OF THE DRAWINGS

These and other features of the invention will become more apparent from the following description in which reference is made to the appended drawings in which.

DETAILED DESCRIPTION

In the following detailed description, numerous specific details are set forth in order to provide a thorough understanding of the present invention. However, it will be understood by those skilled in the art that the present invention may be practiced without these specific details. In other instances, well known methods, procedures, components and circuits have not been described in detail so as not to obscure aspects of the present invention.

The present invention provides two embodiments of a bit masking method and corresponding masking circuits for use therewith. In general, the masking methods involve applying bi-dimensional masks to the test response data captured by the memory elements. The bi-dimensional masks include a chain mask and a position mask. The chain mask identifies scan chains which have corrupt bits. The position mask identifies bit positions having corrupt bits. In the first embodiment, the two masks are loaded into different registers and the masks are applied simultaneously. In the second embodiment, the masks are loaded into the same register, but applied sequentially, as explained later.

The masked data is then passed to a signature register. The masks can be provided by a tester or by a set of metal-programmable masks called "default masks". In all cases, the masks are loaded into memory elements that can be clocked by the same clock as all other memory elements of the circuit so that the masks can be applied while shifting scan chains at-speed. This is important for bit position masks.

In both embodiments, bit position masks are rotated and applied to several scan patterns, minimizing the amount of mask data to be transferred from the tester. Whenever new mask data is required, synchronization between the tester and the test controller takes place and the rate of transfer is adjusted to match the capacity of the tester. The memory elements capturing corrupt bits and the patterns during which corrupt bits are captured can be identified using a number of different methods including those described in the introductory portion of the present description. However, other methods can be used.

For production testing, it might be advantageous to use more than one mask that can be stored on the tester to maximize fault coverage, specific masks being used for a specific group of patterns. However, for field tests, it is more advantageous to combine the masks into a small number, ideally one, to simplify the application of the test. This is done at the expense of fault coverage. The two embodiments of the masking circuit of FIGS. 1 and 2 are now described in more detail below.

Embodiment 1

Figure 1:
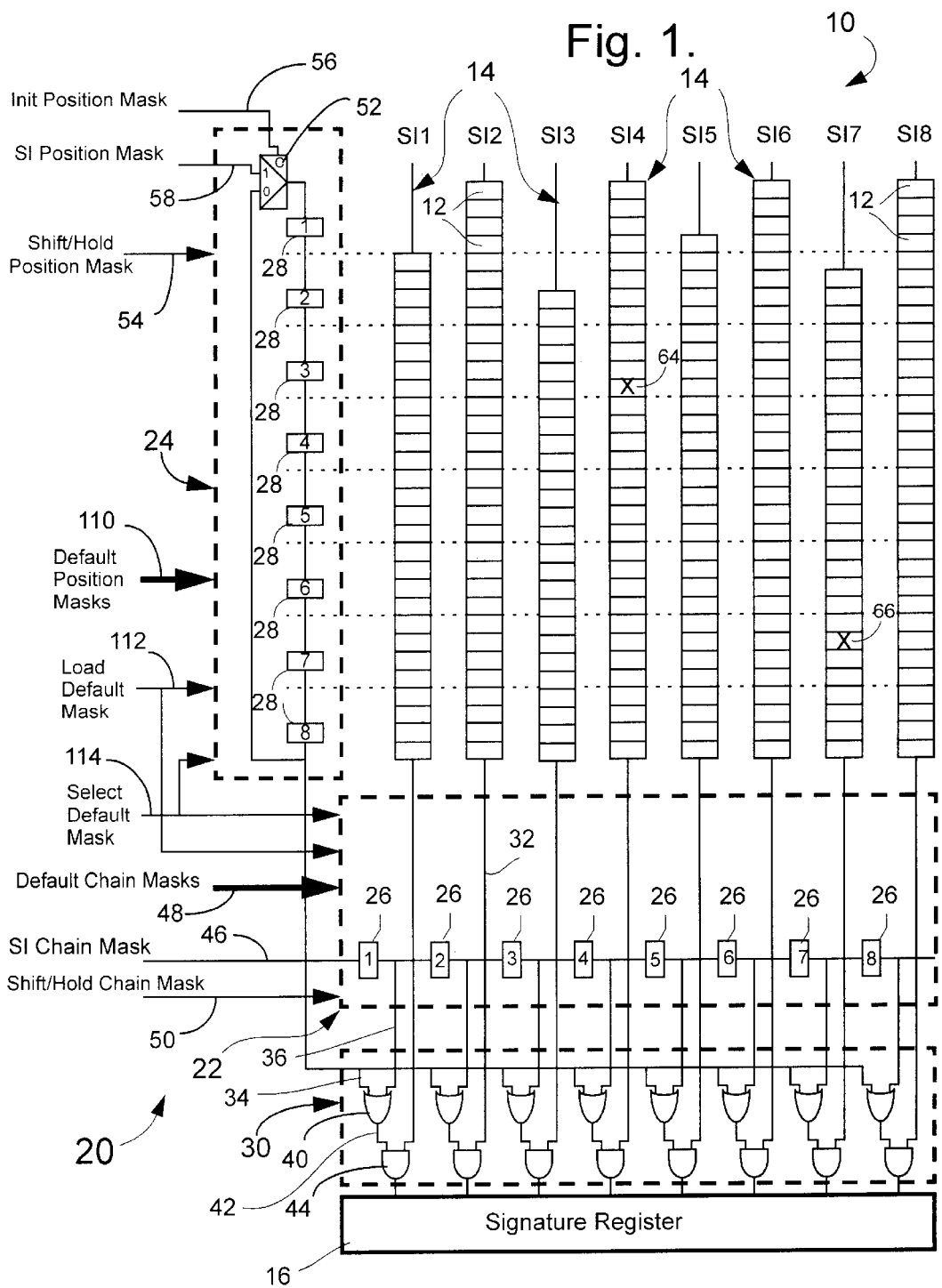
FIG. 1 illustrates a masking circuit according to one embodiment of the present invention for applying a bi-dimensional mask in a single step.
Figure 2:
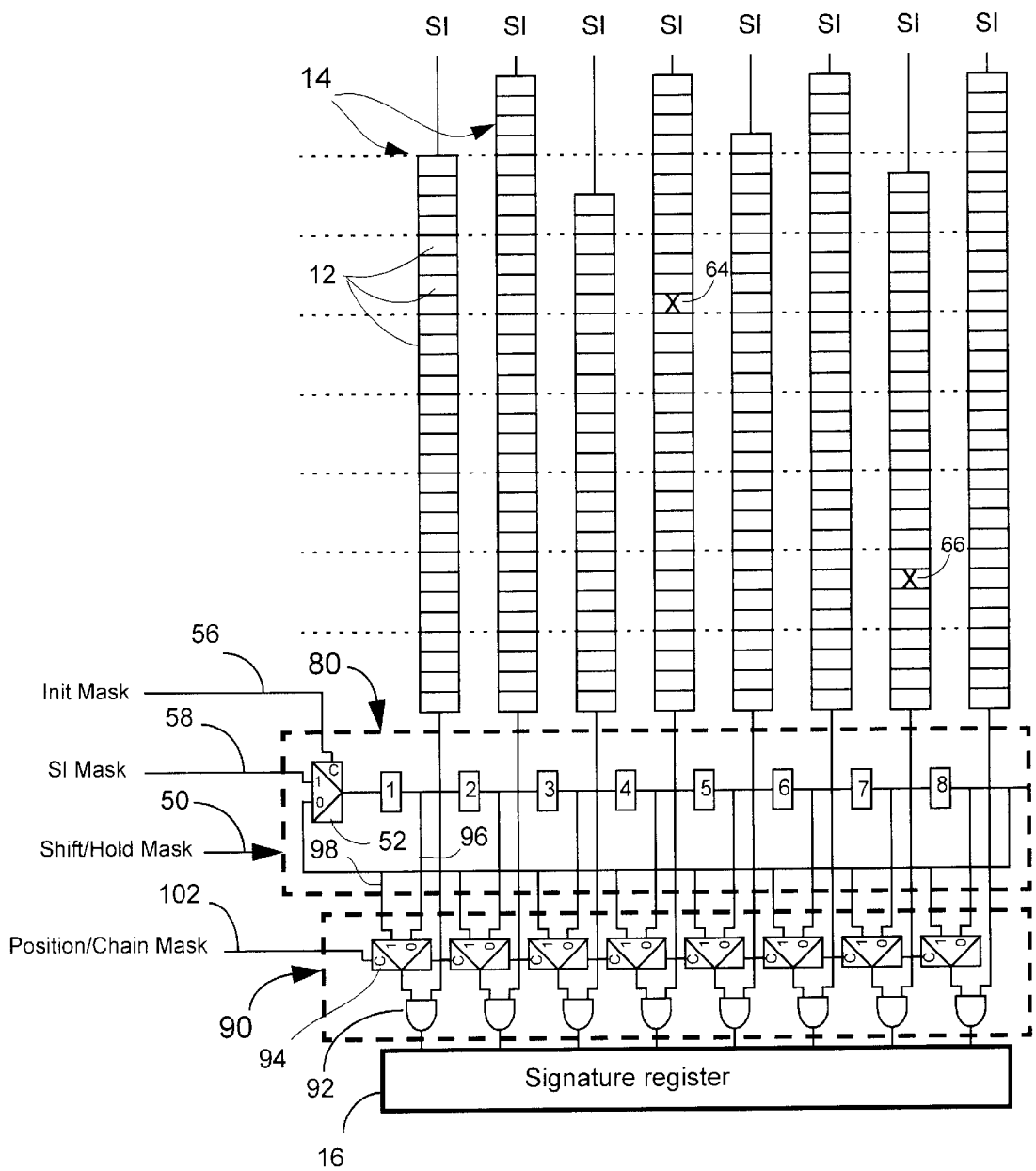
FIG. 2 illustrates a circuit according to another embodiment of the present invention for applying a bi-dimensional mask in two steps.

FIG. 1 illustrates a masking circuit, according to an embodiment of the present invention, which is used to apply a bi-dimensional mask in a single step. This embodiment is generally defined as a method of masking corrupt bits in test response pattern scan chains in an integrated circuit, comprising loading and applying a set of test patterns in said scan chains so as to obtain corresponding test response patterns; and masking bits of the test response patterns identified by a chain mask and at a position identified by a position mask.

FIG. 1 illustrates a portion of an integrated circuit 10 having memory elements 12 arranged into scan chains 14 having respective serial inputs SI1 to SI8. The serial outputs of the scan chains are connected to a signature register 16 through a masking circuit 20, described below. As is well known in the art, the memory elements are connected to combinational logic (not shown) and are able to capture data applied to the combinational logic as well as the response of the circuit to the applied data.

One aspect of the present invention provides a masking circuit 20 having storage means which includes a scan chain mask register 22 for storing a chain mask and a position mask register 24 for storing a position mask. The chain mask register has chain mask register memory elements 26. Eight chain mask register elements are shown and labeled 1 to 8. Each element 26 is shown as associated with a scan chain. However, each element may be associated with more than one scan chain. Each chain mask register element stores a bit which indicates whether its associated scan chain(s) contains bits which are to be masked. Position mask register 24 has position mask register memory elements 28, labeled 1 to 8, and each of which stores a position mask bit identifying scan chain bit positions to be masked. The masking circuit further includes a gating circuit 30 having a scan chain input 32 for each scan chain and connected to the serial output of the associated scan chain, a position mask input 34 connected to the serial output position mask register, and a chain mask input 36 for each chain mask register memory element 26. The masking circuit further includes first gating means 40 for gating the currently active position mask bit with each of the chain mask inputs for generating a masking bit 42 and second gating means 44 for coupling the masking bit with the serial output of each scan chain.

Chain Mask Register

As mentioned, each chain mask memory element 26 is associated with a scan chain in this embodiment. However, in general, a memory element can be associated with more than one scan chain. Thus, where a memory element 26 is associated with several scan chains, the output of gate 40, masking bit 42, is applied to the input of the AND gates 44 corresponding to each associated chain. This provides a first level of trade-off between fault coverage and circuit size. The outputs of the chain mask register memory elements are applied in parallel to gating circuit 30. Each chain mask memory element 26 contains a value of logic 0 or logic 1. In this embodiment, a chain mask memory element contains a logic 0 if any memory element in the associated chain, or group of chains, captures corrupt bits, which are to be masked, for the current set of test patterns. Otherwise the memory element will contain a value of logic 1. The chain mask bits can be loaded a number of ways. In the present embodiment, the bits can be shifted in via chain mask serial input 46 or loaded in parallel via default chain masks input 48. In the illustrated example, the number of different masks is sufficiently small that a test can be interrupted to load a new mask, possibly from a tester, without causing significant increase in test time. Shift operations are controlled via Shift/Hold input 50 that configures the chain mask bits into a shift mode or in a hold mode. The shift mode is used to load a chain mask. After the chain mask has been loaded, the memory elements are placed in hold mode so that the chain mask memory elements hold their values during test operations.

If the number of masks is large or if masks need to be changed frequently, it might be necessary to duplicate all memory elements of the chain mask register and to provide a shadow register or secondary chain mask register (not shown) for use in serially loading the next mask while the circuit is being tested. The new mask is transferred from the shadow register to the main register when the response of the set of patterns requiring the new mask is being analyzed. Another control signal (not shown), would be required to perform the transfer.

Position Mask Register

Memory elements 28 of the position mask register 24 are similar to those of chain mask register 22. However, only one position mask bit is active at a time. That bit is bit 8 of the position mask register. The output of the register is applied serially to serial inputs 34 of gating logic 30. One input 34 is associated with each scan chain. The output of bit 8 is also connected to the serial input of the first position mask memory element, bit 1, through multiplexer 52. The latter connection allows the position mask to be rotated and reused any number of test patterns. The position mask is indexed forward by one bit after the contents of the test response bits of the memory elements associated with position mask bit 8 have been processed and shifted out. Thus, the bit in position mask bit 8, the active bit, is advanced to position mask bit 1, the bit in position mask bit 7 is advanced to position mask bit 8. The same applies to all other position mask bits. Position mask bit 8 is then applied to the next four bits (in this example) of the current test response pattern. This is repeated until the contents of all memory elements in the scan chains have been shifted out. The mask bits are indexed by applying an active (logic 1) signal to Shift/Hold input 54 of the position mask register and one cycle of a clock to the clock input of the position mask register memory elements. An inactive (logic 0) Shift/Hold signal is then applied to configure the memory elements in hold mode. The position mask register is maintained in hold mode for four clock cycles, allowing four bits of the scan chains to be processed.

When all eight bits of the position mask have been processed, the position mask have returned to its initial value. The output response of a new test pattern can then be analyzed.

Unlike the chain mask register, the position mask register does not need to be duplicated, even if there are frequent position mask changes. This is because only one bit of the position mask register is active at a time. A new position mask can be shifted in for the next test pattern at the same time the current position mask is being used. The rotation of the current position mask is disabled by applying an active value to the Init position mask input 56 to allow a new mask to be shifted in via the Si position mask serial input 58.

In the embodiment of FIG. 1, one position mask bit is provided for every four memory elements of the circuit scan chains. Thus, four bits in the test response pattern are masked when a position mask bit is active. The difference in the number of position mask bits and the number of memory elements reduces the amount of data that needs to be stored on the tester and might facilitate the synchronization between the on-chip test circuitry and the tester. For example, if memory elements of the masking circuit are operating at a high clock rate and the tester can only provide new mask data at a lower clock rate and the clocks are asynchronous with each other, a synchronization technique similar to the one described in U.S. Pat. No. 5,900,753 issued on May 4, 1999 for "Asynchronous Interface" and incorporated herein by reference.

Gating Circuit

Gating logic 30 is arranged so that the serial output of a test response scan chain is masked if both its associated chain mask bit and the active position mask bit, indicate the potential presence of corrupt bits. First and second gating means 40 and 44 are provided for each scan chain 14. In the illustrated embodiment, first gating means 40 is in the form of an OR gate having one input connected to the serial output of position mask register 24 and another output connected to the output of an associated chain mask register memory element 26. The output of the OR gate is a masking bit. Second gating means 42 is in the form of an AND gate having one input connected to the output of the OR gate and a second input which connected to the serial output of the associated scan chain 14.

Thus, first gating means 40 is provided for gating the currently active position mask bit with each of the chain mask inputs for generating a masking bit 42 and second gating means 44 is provided for coupling the masking bit with the serial output of each scan chain. In the illustrated embodiment, this means that both the chain mask bit and position mask bit are inactive (logic 0). The masking will cause a value of logic 0 to be applied to the input of the signature register instead of the potentially corrupt bit. Several different, and equivalent, designs of the gating logic exist. For example, AND gate 44 can be replaced by an OR gate, OR gate 40 can be changed to an AND gate and the polarity of the position and chain mask can be inverted, i.e. a logic 1 would indicate the potential presence of corrupt bits for this position or chain. This gating logic would then mask corrupt bits by causing a value of logic 1 to be applied to the input of the signature register. The only important consideration when designing the gating logic is to ensure that a known value is applied to the input of the signature register at any given time.

In the example of FIG. 1, there are two memory elements, elements 64 and 66, whose test response may be corrupt. Assume that the memory elements become corrupt for two disjoint sets of patterns, i.e., the two memory elements never capture corrupt bits at the same time. This means that it is possible to define two sets of masks that will be applied for different sets of patterns. The position mask and chain mask are '11011111' and '111101111', respectively, for the memory element 64 of the chain 4 that might capture corrupt bits. The position and chain masks for the memory element 66 of chain 7 are '11111101' and '11111101', respectively. The leftmost bit of the masks is associated with memory element number 1 of the corresponding mask register. If there are several patterns for which none of the memory elements capture corrupt bits, it might be convenient to disable the masking of all memory elements by using the '11111111' mask for both the position and chain masks.

The masks might have to be changed frequently, for every pattern in the worst case. There are a few techniques which can be used to minimize the number of mask changes. For example, in a circuit where the test patterns are generated by an Automatic Test Pattern Generation (ATPG) program and applied from a tester, it is relatively easy to re-order the patterns. For a circuit where the test patterns are generated on-chip, it is more difficult to re-order the patterns because appropriate seeds are needed for the pattern generator and signature register for each set of patterns. In this case, masks can be combined to help reduce the number of sets and, therefore, the number of times the pattern generator and signature register need to be re-seeded. For the embodiment of FIG. 1, a single set of position and chain mask would be '11011101' and '11101101'. The combined set of mask is simply calculated by performing a bit-wise AND operation on the corresponding masks, i.e. the two position masks are ANDed together and the chain masks are ANDed together.

The combination of the masks might reduce the fault coverage. This is not only the result of the memory elements capturing corrupt bits being masked more often because of being used in more patterns, there are also more memory elements that never capture corrupt bits that might be masked. For example, in FIG. 1, the combined set of masks will mask memory elements in chain 4, position 7 and those in chain 7, position 3 which never capture corrupt bits.

In general, the fault coverage reduction of a pattern set can be approximated as follows:

$$FC\_reduction=(N\_masked\_chains*N\_masked\_positions)/(N\_chains*N\_positions) \quad (1)$$

where:

FC_reduction is the reduction in fault coverage;

N_masked_chains is the number of masked chains during application of the pattern set;

N_masked_positions is the number of masked positions;

N_chains is the total number of chains;

N_positions is the total number of positions.

In Equation (1) it is assumed that each memory element observes the same number of faults. For the circuit of FIG. 1, the use of two sets of masks yields a fault coverage reduction of about 1.6% assuming that masking is never disabled. The combined mask set yields a fault coverage reduction of about 6.4%. This reduction is still quite acceptable for a field test that would have otherwise failed completely.

Consider a typical circuit block of 1 or 2 million gates and with 64,000 memory elements distributed in 64 chains of 1000 memory elements. Assume that two 32-bit registers are used for the position and chain masks and that a maximum of three chains and three positions (each position actually represents 32 memory elements) are masked at any given time. Then, the fault coverage reduction is less than 1% which is excellent. Several trade-offs are possible by modifying the size of the mask registers to maximize fault coverage and minimize test circuitry size.

Embodiment 2

Another type of trade-off can be made by sharing the memory elements used in the position and chain mask registers. FIG. 2 illustrates the same circuit as FIG. 1 with a different masking circuit according to a second embodiment of the present invention by which a bi-dimensional mask is applied in two steps.

The embodiment of FIG. 2 provides a single mask register 80 which is used for both the position and chain mask register. Instead of applying the position and chain masks of a mask set simultaneously, as in the embodiment of FIG. 1, the masks are applied sequentially. Gating logic 90 is slightly different from gating logic 30 of FIG. 1. Gating circuit 90 includes an AND gate 92, one AND gate for each scan chain, and a multiplexer 94, one for each chain or group of chains controlled by a single mask bit. Each multiplexer 94 has a first input 96 connected to the output of an associated register memory element 100 and a second input 98 connected to the serial output of mask register 80, i.e. the output of bit 8 of the register. A position/chain mask control input 102 is used to select between a position mask mode and chain mask mode. An active value (logic 1) configures the mask register in a position mask mode and an inactive value (logic 0) configures the mask register in a chain mask mode. In chain mask mode, multiplexers 94 select a first input 96 which is the output of a corresponding mask bit used to store a chain mask bit. Each multiplexer selects a different mask bit. However, in position mask mode, multiplexers 94 select the input 98, the output of the last memory element used to store the position mask. In this embodiment, it so happens that the position mask and chain mask are of the same length and this is why the multiplexer associated with that last memory element receives both inputs from the same source. However, this is not necessarily so for all circuits. In general, the multiplexers would receive inputs from different sources.

The mask register is initialized in the same manner for both the position mask mode and the chain mask mode, and that is via multiplexer 52. Mask register 80 is operated in the same manner as chain mask register 22 of FIG. 1 when control signal 102 is inactive (logic 0). That is, once initialized, the register is configured in a hold mode by applying an inactive value to input 50 (Shift/hold chain mask) for the time the chain mask is required. However, mask register 80 is operated in the same manner as position mask register 24 of FIG. 1 when control signal 102 is active (logic 1). That is, the position mask is indexed by one bit after the contents of all memory elements associated with the bit in position mask bit 8 have been processed and shifted out. The position mask is re-circulated by multiplexer 52 so that the position mask can be re-used for the next pattern. Alternatively, a new mask (position and/or chain) can be shifted in.

The two step process mentioned earlier refers to the processing of a test pattern using one of the position mask or the chain mask for a particular test pattern and then processing the test pattern using the other of the position mask or the chain mask. Thus, when the position mask is loaded and the register is operated in position mask mode, the net effect is that, in all scan chains, the test response bit located at the position specified by the active bit (the bit in mask register memory element 8) will be masked. Similarly, when the chain mask is loaded into the mask register and the register is operated in chain mask mode, all bits in the scan chains identified in the chain mask will be masked.

This embodiment of the method is generally defined as loading and applying first test patterns into the circuit so as to obtain first circuit test response patterns; loading a position mask into a mask register of the integrated circuit, while scanning out the first test response patterns along the scan chains, selecting each bit in the register in a predetermined sequence, and applying a masking bit in the first test response patterns at the position corresponding to the position bit in each the scan chains; loading and applying second test patterns to the circuit so as to obtain second circuit test responses; loading a chain mask into the mask register; while scanning out the second test response patterns along the scan chains, applying a masking bit to each bit of scan chains identified in the chain mask.

For small test pattern sets, it might be necessary to repeat the entire set to achieve the same fault coverage reduction obtained when the mask set is applied simultaneously. However, for large test pattern sets and when faults are detected multiple times, it might not be necessary to repeat patterns. Typically, the position and chain masks of a mask set would be used for half of the patterns but a more detailed analysis (fault simulation) might show than one should be used more often than the other to maximize fault coverage.

The signature register can take any of several forms that are well known in the art. It can include a space compactor to reduce the number of memory elements required to build the register. In fact, the signature register can be absent and the space compactor output connected directly to circuit outputs.

Both chain mask register and position mask register of FIG. 1 have an optional default mode of operation. This feature is particularly useful for field tests where no tester id available to store the mask information and transfer the mask information using the mechanism described above. The default mode of operation is also useful to simply reduce the amount of test data that needs to be stored on the tester. This feature is only applicable to the situation where the source of corrupt bits is known at design or layout time. For example, an embedded core that was not designed to receive pseudo-random patterns from a test controller might capture unpredictable data for some of the patterns. It might not be possible to modify the core. More than one default mask might be required to accommodate different test sequences.

Default chain masks can be loaded via input 48 and default position masks can be loaded via default mask input 110 when load default mask input 112 is active. If more than one default mask is implemented, a default mask selection mechanism is also implemented. Select default mask input 114 is used for this purpose. In this particular example, only two sets of default masks are used and only one such select input is required. However, more inputs are needed if more defaults are implemented.

Mask Register Memory Element

Figure 3:
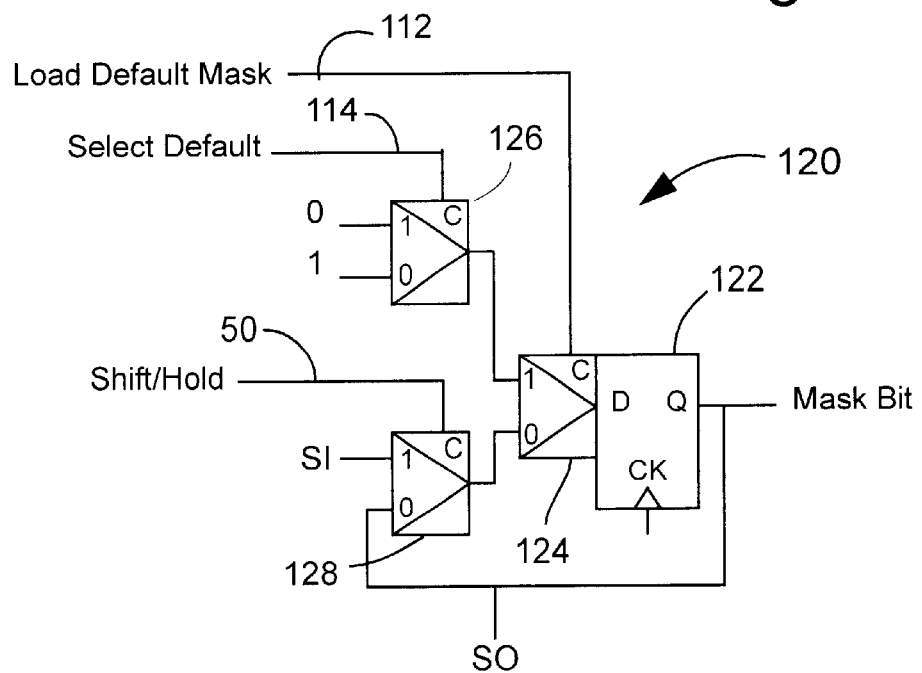
FIG. 3 is a detailed schematic of a shift register element mask circuit according to one embodiment of the present invention.

FIG. 3 shows an example of implementation of one memory element 120 of either a chain mask register or a position mask register. The memory element includes a storage device such as a flip-flop 122 having an input multiplexer 124. The output of a default mask multiplexer 126 is connected to the '1' input of input multiplexer 124. The output of a shift/hold mode multiplexer 128 is connected to the '0' input of input multiplexer 124. When the Shift/Hold input 50 is active and Load default input 112 is inactive, mask bits are serially loaded from input SI. When the Load Default input 112 is active, a default mask bit value is loaded. In this example, two default values are selectable using the Select Default input 114. The 0 value is selected if Select Default is active (1) and the 1 value is selected if Select Default is inactive (0).

This circuit can be simplified significantly if the default values are known at design time. However, no changes can be made to the default mask values during layout. Changes might be necessary because the position of corrupt bits might change due to chain re-ordering which can occur during layout. The circuit shown in figure allows changes to made easily if the connections to the data inputs of multiplexer 126 are in the form of 'metal straps'. This method is used to program the default signature of BIST controllers which are also sensitive to the final chain ordering of the circuit. Metal straps are easy to change in the final layout stages. When both the Shift/Hold input and Load default inputs are inactive, all memory elements of the chain mask register and position mask register hold their current state.

Figure 4:
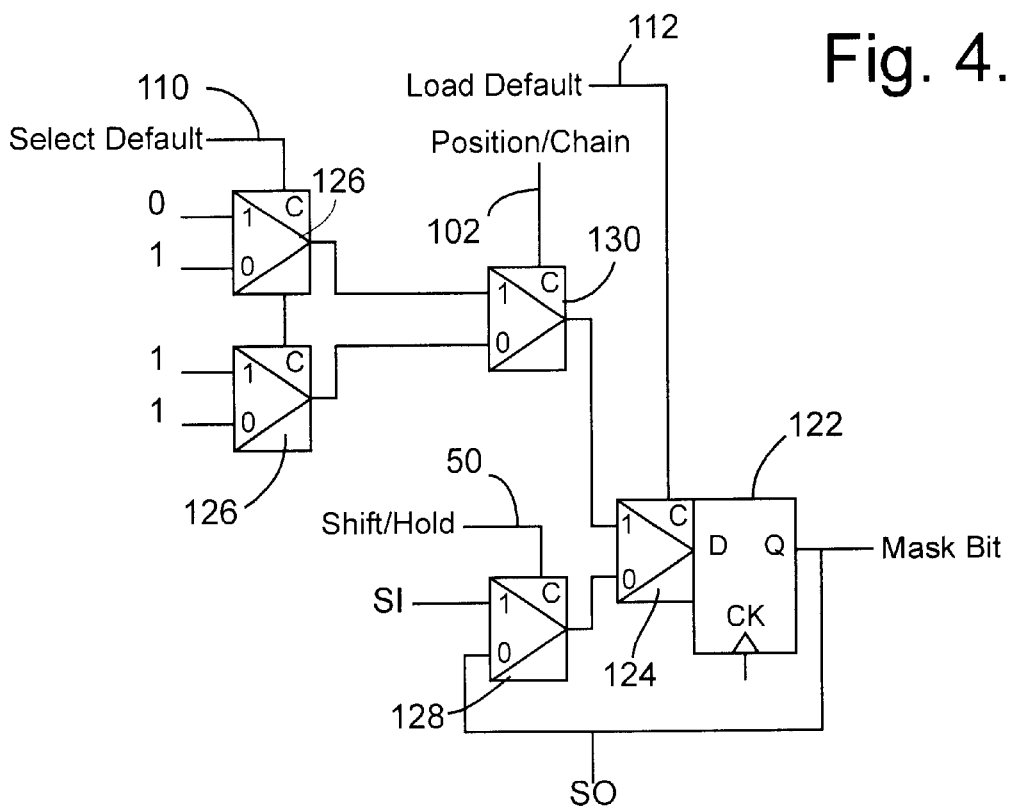
FIG. 4 is a detailed schematic of a shift register element mask circuit according to another embodiment of the present invention.

Mask register 80 of FIG. 2 can also have a default mode of operation. It would use memory elements similar to the one shown in FIG. 4 for the memory elements that are shared by the position and chain mask. The memory element is substantially the same as that of FIG. 3 and, therefore, the same numerals have been used to designate like elements. The only difference with the memory element of FIG. 3 is the provision of an additional selector 130 to select the appropriate default according to Position/Chain control signal 114. An inactive value (0) of control signal 114 selects a default chain default value and an active value (1) of control signal 114 selects a default position mask value. Again here, the circuit can be simplified significantly if the default values at design time as described in the previous paragraph.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A masking circuit for use in an integrated circuit for masking bits in scan chains in said integrated circuit, comprising:

mask storage means including:

a scan chain mask register for storing a scan chain mask, said register having chain mask register elements, each said elements being associated with one or more scan chains identifying scan chains in which bits are to be masked;

a bit position mask register for storing a position mask, said position mask register having position mask register elements, each said position mask register elements storing position mask bit identifying scan chain bit positions to be masked; and a gating circuit having a scan chain input for each said scan chain connected to the serial output of said scan chains, a bit position mask input connected to bit position mask register, a chain mask input connected to said chain mask register, first coupling means for coupling said position and chain mask inputs and generating a masking bit and second coupling means for coupling said masking bit with a serial output of each said scan chain.

2. A masking circuit as defined in claim 1, said bit position mask register having a serial input and a serial output, and selector means having a first input for receiving serial input data, a second input connected to said serial output of said bit position mask register and a control input for selectively connect one of said first and second inputs to serial input of said register.

3. A masking circuit as defined in claim 2, said serial output of said bit position mask register being connected to said bit position mask input of each said gating circuit.

4. A masking circuit as defined in claim 1, said chain mask input being connected to an output of a shift register memory element of said chain mask register.

5. A masking circuit as defined in claim 1, each said register being configurable in shift mode for loading a mask there into and in hold mode for holding mask bits constant.

6. A masking circuit as defined in claim 1, said storage means further including at least one default bit position mask register for storing a default bit position mask and means for selectively loading the contents of said default bit position mask into said bit position mask register.

7. A masking circuit as defined in claim 1, said storage means further including at least one default chain mask register for storing a default chain mask and means for selectively loading the contents of said default chain mask into said bit chain mask register.

8. A masking circuit for use in an integrated circuit for masking bits in scan chains in said integrated circuit, comprising:

mask storage means including:

a mask register having a serial input, a serial output and a plurality of register elements, each register element being associated with one or more scan chains for storing a mask data; and gating means associated with each said scan chain, each said gating means having an input for receiving the serial output each said associated scan chain, a position mask input connected to the serial output of said mask register, and a chain mask input connected to the output of an associated mask register element, and an output, said gating means being responsive to a mode control input for selecting between one of said position and mask inputs for gating the selected input with the said chain serial output.

9. A masking circuit as defined in claim 8, said gating means including a selector, one input of said selector being said position mask input, another input of said selector being said chain mask input, said selector having a control input for selecting between said inputs.

10. A masking circuit as defined in claim 8, said storage means further including at least one default position mask register for storing a default bit position mask and means for selectively loading the contents of said default bit position mask into said bit position mask register.

11. A masking circuit as defined in claim 8, said mask register having means for selectively applying a position mask or a chain mask.

12. A masking circuit as defined in claim 11, said register being operable to load mask sets comprising masks formed by performing bit-wise operations on position mask and chain mask sets.

13. A masking circuit as defined in claim 12, said performing bit-wise operations being ANDing all masks to be combined.

14. A masking circuit as defined in claim 12, where performing bit-wise operations means ORing all masks to be combined.

15. A masking circuit for use in an integrated circuit for masking bits in scan chains, comprising:
    mask storage means for storing a bit position mask identifying scan chain bit positions to be masked and a chain mask identifying scan chains having bits to be masked; and
    gating means associated with each said scan chain, each said gating means having a scan chain input for receiving the serial output of an associated scan chain, a position mask input connected to a position mask output of said storage means, and a chain mask inputs connected to a chain mask outputs of said storage means, and a gating means output corresponding to each said scan chain, said gating means being operable to gate a masking bit derived from said position and chain mask inputs with said scan chain serial output and apply a resulting gated bit to said gating means output.

16. A method of masking corrupt bits in test response pattern scan chains in an integrated circuit, comprising:
    loading and applying a set of test patterns in said scan chains so as to obtain corresponding test response patterns; and
    masking bits of said test response patterns located in scan chains identified by a chain mask and at a position identified by a position mask.

17. A method as defined in claim 16, said chain mask having a predetermined number of chain mask bits, said chain mask bits having a first value when bits of corresponding scan chains are to be masked and a second value when bits of corresponding scan chains are not to be masked; said position mask having a predetermined number of position mask bits, said position mask bits having a first value when bits located at predetermined position of scan chains are to be masked and a second value when bits located at said predetermined position of said scan chains are not to be masked.

18. A method as defined in claim 17, said masking bits of said test response patterns comprises masking a bit in said test response patterns when an active position bit has said position bit first value and a scan chain mask bit has said chain mask first value.

19. A method as defined in claim 17, said masking bits of said test response patterns including:
    while shifting out said test response patterns:
        selecting a position mask bit from said position mask; and
        when the value of said selected position mask bit corresponds to said position mask bit first value, substituting a masking bit for a bit of the test response pattern of each scan chain whose corresponding chain mask bit has said chain mask first value.

20. A method as defined in claim 19, said selecting a position mask bit from said position mask comprising rotating said position mask so that said position mask bit appears at an output of said position mask register.

21. A method as defined in claim 20, said rotating said position mask includes connecting the output of said position mask register to an input of said position mask register and indexing said position mask so that said position mask bits are advanced by one or more positions in said register.

22. A method as defined in claim 19, further including, performing said substituting a masking bit for each cycle of a predetermined number of cycles of a shift clock used to unload a test response.

23. A method as defined in claim 19, said selecting a position mask bit from said position mask comprising selecting said position mask bits in a predetermined sequence.

24. A method as defined in claim 23, said predetermined sequence being a consecutive sequence.

25. A method as defined in claim 19, said predetermined number of cycles being one or more.

26. A method as defined in claim 19, said substituting a masking bit including gating said position mask bit with a bit corresponding to each said scan chain to generate said masking bit.

27. A method as defined in claim 16, further including:
    loading a position mask into a position mask register, said position mask identifying scan chain bit positions having corrupt bits;
    loading a chain mask into a chain mask register, said chain mask identifying scan chains having corrupt bits.

28. A method as defined in claim 16, said masking bits of said test response including, while shifting said test response along said scan chains, masking a bit in each scan chain identified in said chain mask and said position mask.

29. A method as defined in claim 16, said masking bits including:
    for each position mask bit of said position mask:
        applying said position mask bit to each of a predetermined number of bits of each scan chain identified in said chain mask.

30. A method as defined in claim 16, further including loading at least one default bit position mask into a default bit position mask and selectively loading the contents of said default bit position mask into said bit position mask register.

31. A method as defined in claim 16, further including loading at least one default chain mask into a default chain mask register and selectively loading the contents of said default bit position mask into said chain mask register.

32. A method as defined in claim 16, further including loading a chain mask into a secondary chain mask register while testing said circuit and transferring the contents of said secondary chain mask register to said chain mask register when required.

33. A method as defined in claim 16, said chain mask having a predetermined number of chain mask bits, each chain mask bit being associated with a second predetermined number of chains.

34. A method as defined in claim 33, said second predetermined number being one.

35. A method as defined in claim 16, said position mask having a predetermined number of position mask bits, each position mask bit being associated with a second predetermined number of bit positions.

36. A method as defined in claim 35, said second predetermined number of bit positions being a power of two.

37. A method as defined in claim 35, said second predetermined number of bit positions being one.

38. A method as defined in claim 35, further including loading of said masks while said output response is being shifted out.

39. A method as defined in claim 35, further including loading at least one default bit position mask into a default bit position mask and selectively loading the contents of said default bit position mask into said bit position mask register.

40. A method as defined in claim 35, further including loading at least one default chain mask into a default chain mask register and selectively loading the contents of said default bit position mask into said chain mask register.

41. A method as defined in claim 35, further including loading a chain mask into a secondary chain mask register while testing said circuit and transferring the contents of said secondary chain mask register to said chain mask register when required.

42. A method of masking corrupt bits in test response pattern scan chains in an integrated circuit, comprising:
  loading one of a position mask and a chain mask into a mask register;
  loading and applying first test patterns to said circuit so as to obtain first circuit test response patterns;
  while scanning out said first circuit test response patterns along said scan chains, applying masking bits from said mask register to said first circuit test response patterns;
  loading and applying second test patterns to said circuit so as to obtain second circuit test response patterns;
  loading the other of said position mask and said chain mask into said mask register; and
  while scanning out said second test response patterns along said scan chains, applying masking bits from said mask register to said second circuit test response patterns.

43. A method as defined in claim 42, when a mask loaded into said mask register is a position mask, said applying masking bits includes selecting each bit in said register in a predetermined sequence, and applying a masking bit in each said test response pattern at the position corresponding to said position bit.

44. A method as defined in claim 42, when a mask loaded into said mask register is a chain mask, said applying masking bits includes applying a masking bit to each bit of test response patterns in scan chains identified in said chain mask.

45. A method as defined in claim 42, said second test patterns being the same as said first test patterns.

46. A method as defined in claim 42, said second test patterns being different from said first test patterns.

47. A method as defined in claim 42, said chain mask having a predetermined number of chain mask bits, each chain mask bit being associated with a second predetermined number of chains.

48. A method as defined in claim 47, said second predetermined number being one.

49. A method as defined in claim 42, said position mask having a predetermined number of position mask bits, each position mask bit being associated with a second predetermined number of bit positions.

50. A method as defined in claim 49, said second predetermined number of bit positions being a power of two.

51. A method as defined in claim 49, said second predetermined number of bit positions being one.

52. A method as defined in claim 49, further including loading of said masks while said output response is being shifted out.

53. A method as defined in claim 42, further including loading at least one default bit position mask into a default bit position mask and selectively loading the contents of said default bit position mask into said bit position mask register.

54. A method as defined in claim 42, further including loading at least one default chain mask into a default chain mask register and selectively loading the contents of said default bit position mask into said chain mask register.

55. A method as defined in claim 42, further including loading a chain mask into a secondary chain mask register while testing said circuit and transferring the contents of said secondary chain mask register to said chain mask register when required.

* * * * *